(12) United States Patent
Kim et al.

(10) Patent No.: US 12,532,631 B2
(45) Date of Patent: Jan. 20, 2026

(54) ELECTRONIC APPARATUS AND METHOD OF MANUFACTURING THE SAME

(71) Applicant: Samsung Display Co., Ltd., Yongin-si (KR)

(72) Inventors: Byungchul Kim, Yongin-si (KR); Jangwi Ryu, Yongin-si (KR); Jaemin Seong, Yongin-si (KR); Gakseok Lee, Yongin-si (KR); Inseok Song, Yongin-si (KR); Halim Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 924 days.

(21) Appl. No.: 17/743,354

(22) Filed: May 12, 2022

(65) Prior Publication Data

US 2022/0406852 A1 Dec. 22, 2022

(30) Foreign Application Priority Data

Jun. 8, 2021 (KR) .................. 10-2021-0074301

(51) Int. Cl.
*H10K 59/38* (2023.01)
*H10K 59/80* (2023.01)
*H10K 85/60* (2023.01)
*H10K 71/00* (2023.01)

(52) U.S. Cl.
CPC ......... *H10K 59/38* (2023.02); *H10K 59/8792* (2023.02); *H10K 85/60* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 9,680,054 B2 | 6/2017 | Coe-Sullivan et al. | |
| 10,808,174 B2 | 10/2020 | Park et al. | |
| 11,004,918 B2 | 5/2021 | Kim et al. | |
| 11,165,045 B2 | 11/2021 | Yun et al. | |
| 11,983,350 B2 | 5/2024 | Kang et al. | |
| 2010/0177397 A1* | 7/2010 | Kamiyama | H01J 11/44 359/609 |
| 2022/0252769 A1 | 8/2022 | Lee et al. | |

FOREIGN PATENT DOCUMENTS

| | | |
|---|---|---|
| JP | 2009-266478 A | 11/2009 |
| JP | 2010-237374 A | 10/2010 |
| KR | 10-2015-0077764 A | 7/2015 |
| KR | 10-2018-0077086 A | 7/2018 |
| KR | 10-2019-0107262 A | 9/2019 |
| KR | 10-2019-0143556 A | 12/2019 |
| KR | 10-2020-0001649 A | 1/2020 |
| KR | 10-2020-0141325 A | 12/2020 |
| KR | 10-2195638 B1 | 12/2020 |
| KR | 10-2021-0014567 A | 2/2021 |

* cited by examiner

*Primary Examiner* — Gregory D Clark
(74) *Attorney, Agent, or Firm* — Womble Bond Dickinson (US) LLP

(57) ABSTRACT

An electronic apparatus and a method of manufacturing the same are provided. The electronic apparatus includes: a substrate; a light source on the substrate; a color conversion layer on the light source; a UV-absorbing layer on the color conversion layer; and a color filter on the UV-absorbing layer.

20 Claims, 2 Drawing Sheets

ELECTRONIC APPARATUS AND METHOD OF MANUFACTURING THE SAME

CROSS-REFERENCE TO RELATED APPLICATION

This application claims priority to and the benefit of Korean Patent Application No. 10-2021-0074301, filed on Jun. 8, 2021, in the Korean Intellectual Property Office, the disclosure of which is incorporated by reference herein in its entirety.

BACKGROUND

1. Field

One or more embodiments relate to an electronic apparatus and a method of manufacturing the same, the electronic apparatus including a substrate, a light source, a color conversion layer, a UV-absorbing layer, and a color filter.

2. Description of the Related Art

Along with the development of various electronic apparatuses such as cell phones, PDAs, computers, and/or large-screen TVs, various kinds (e.g., types) of electronic devices (for example, display devices) that can be applied thereto have been developed. For example, electronic devices widely utilized in the market include a liquid crystal display that includes a backlight unit and an organic light-emitting display that emits light of different colors for each color region. Recently, display devices including a quantum dot-color conversion layer (QD-CCL) have been developed. Quantum dots are excited by incident light to emit light having a longer wavelength than that of the incident light, and light of a low wavelength band is mainly utilized for the incident light. As the usages of electronic devices have recently been diversified, various designs for improving the quality of electronic devices have been proposed.

SUMMARY

Aspects according to one or more embodiments are directed toward an electronic apparatus with improved quality and a method of manufacturing the same. However, these aspects are examples only, and should not limit the scope of the present disclosure.

Additional aspects will be set forth in part in the description, which follows and, in part, will be apparent from the description, or may be learned by practice of the presented embodiments of the disclosure.

According to one or more embodiments, an electronic apparatus includes:
a substrate,
a light source on the substrate,
a color conversion layer on the light source,
a UV-absorbing layer on the color conversion layer, and
a color filter on the UV-absorbing layer,
wherein the UV-absorbing layer is to absorb a portion of light emitted from the light source and the color conversion layer.

According to one or more embodiments, a method of manufacturing an electronic apparatus, the method includes:
preparing a light source on a substrate,
preparing a color conversion layer on the light source,
preparing a UV-absorbing layer on the color conversion layer, and
preparing a color filter on the UV-absorbing layer.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
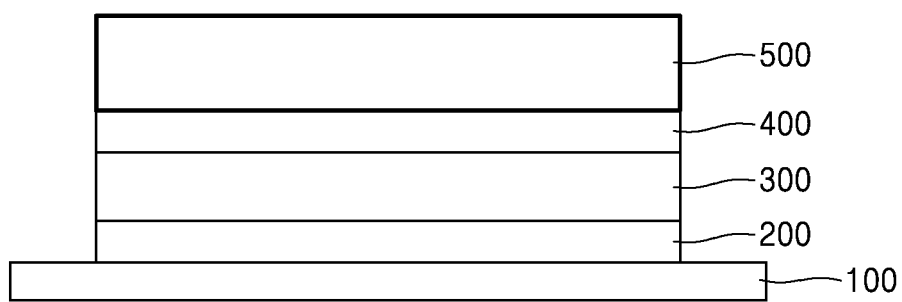
FIG. 1 is a schematic cross-sectional view of an electronic apparatus according to an embodiment.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the present disclosure may have diverse modified embodiments, embodiments are illustrated in the drawings and are described in the detailed description. Effects, features, and a method of achieving the present disclosure will be obvious by referring to example embodiments of the present disclosure with reference to the accompanying drawings. The present disclosure may, however, be embodied in many different forms and should not be construed as limited to the embodiments set forth herein.

Hereinafter, embodiments of the present disclosure will be described in more detail with reference to the accompanying drawings. The same or corresponding components will be denoted by the same reference numerals, and thus redundant description thereof will not be repeated (e.g., will be omitted).

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

In the following embodiments, terms such as first, second, and/or the like are used only for the purpose of distinguishing one component from another component.

An expression used in the singular encompasses the expression of the plural, unless it has a clearly different meaning in the context.

It will be further understood that the terms "comprises" and/or "comprising" as used herein specify the presence of stated features or elements, but do not preclude the presence or addition of one or more other features or elements.

When a certain embodiment is implemented differently, a specific process order may be performed differently from the described order. For example, two processes described in succession may be performed substantially concurrently or simultaneously, or may be performed in an order opposite to the described order.

In the present specification, the expression "A and/or B" refers to A, B, or both A and B. The expression "at least one of A and B" refers to A, B, or both A and B.

Hereinafter, an electronic apparatus 1 according to an embodiment will be described with reference to FIG. 1.

Referring to FIG. 1, the electronic apparatus 1 according to an embodiment includes:

a substrate 100;
a light source 200 on the substrate 100;
a color conversion layer 300 on the light source 200;
a UV-absorbing layer 400 on the color conversion layer 300; and
a color filter 500 on the UV-absorbing layer 400.

The UV-absorbing layer 400 may absorb a part (e.g., a portion) of light emitted from the light source 200 and the color conversion layer 300.

For example, the UV-absorbing layer 400 may selectively absorb UV light emitted from the light source 200 and the color conversion layer 300.

Substrate 100

For use as the substrate 100, any substrate that is generally utilized in the related art may be utilized, and the substrate 100 may be an inorganic substrate or an organic substrate, each having suitable (e.g., excellent) mechanical strength, thermal stability, transparency, surface smoothness, ease of handling, and/or water resistance.

In an embodiment, the substrate 100 may be an inorganic substrate formed of a transparent glass material having $SiO_2$ as a main component, but the present disclosure is not limited thereto.

In one or more embodiments, the substrate 100 may be an organic substrate having insulating properties. An organic material having insulating properties and constituting the organic substrate may be, for example, selected from polyether sulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP), but the present disclosure is not limited thereto.

Light Source 200

The light source 200 may be on the substrate 100. The light source 200 may emit white light or blue light.

In an embodiment, the light source 200 may include a light-emitting device 200A, and the light-emitting device 200A may emit white light or blue light.

Figure 2:
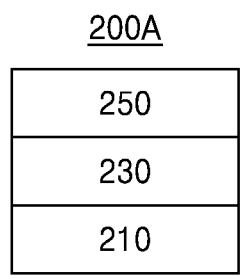
FIG. 2 is a schematic cross-sectional view of a light-emitting device according to an embodiment.

Referring FIG. 2, the light-emitting device 200A includes: a first electrode 210; a second electrode 250 facing the first electrode 210; an interlayer 230 that is between the first electrode 210 and the second electrode 250 and includes an emission layer. The emission layer may emit white light or blue light.

The first electrode 210 may be formed by, for example, depositing or sputtering a material for forming the first electrode 210 on the substrate 100. When the first electrode 210 is an anode, a material for forming the first electrode 210 may be a high-work function material that facilitates injection of holes.

The first electrode 210 may be a reflective electrode, a semi-transmissive electrode, or a transmissive electrode. In an embodiment, when the first electrode 210 is a transmissive electrode, a material for forming the first electrode 210 may include indium tin oxide (ITO), indium zinc oxide (IZO), tin oxide ($SnO_2$), zinc oxide (ZnO), or any combination thereof. In one or more embodiments, when the first electrode 210 is a semi-transmissive electrode or a reflective electrode, a material for forming the first electrode 210 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 210 may have a single-layered structure consisting of a single layer or a multi-layered structure including a plurality of layers. For example, the first electrode 210 may have a three-layered structure of ITO/Ag/ITO.

The interlayer 230 may be on the first electrode 210. The interlayer 230 may include an emission layer.

The interlayer 230 may further include a hole transport region between the first electrode 210 and the emission layer and an electron transport region between the emission layer and the second electrode 250.

The interlayer 230 may further include, in addition to various suitable organic materials, a metal-containing compound such as an organometallic compound, an inorganic material such as quantum dots, and/or the like.

The interlayer 230 may further include: i) two or more emitting units sequentially stacked between the first electrode 210 and the second electrode 250; and ii) a charge generation layer between the two or more emitting units. When the interlayer 230 includes the two or more emitting units and the charge generation layer as described above, the light-emitting device 200A may be a tandem light-emitting device.

The hole transport region may have i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein constituting layers of each structure are sequentially stacked from the first electrode 210 in the respective stated order.

When the light-emitting device 200A is a full-color light-emitting device, the emission layer may be patterned into a red emission layer, a green emission layer, and/or a blue emission layer, according to respective sub-pixels. In an embodiment, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

In the emission layer, an amount of the dopant may be in a range of about 0.01 parts by weight to about 15 parts by weight based on 100 parts by weight of the host.

In one or more embodiments, the emission layer may include quantum dots.

In one or more embodiments, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within these ranges, suitable (e.g., excellent) light-emission characteristics may be obtained without a substantial increase in driving voltage.

The electron transport region may have i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituting layers of each structure are sequentially stacked from the emission layer in the respective stated order.

The electron transport region (for example, the buffer layer, the hole blocking layer, the electron control layer, and/or the electron transport layer in the electron transport region) may include a metal-free compound including at least one $\pi$ electron-deficient nitrogen-containing $C_1$-$C_{60}$ cyclic group.

The second electrode 250 may be on the interlayer 230 having a structure as described above. The second electrode 250 may be a cathode, which is an electron injection electrode, and a material for forming the second electrode 250 may include a metal, an alloy, an electrically conductive compound, or any combination thereof, each having a low-work function.

The material for forming the second electrode 250 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 250 may be a transmissive electrode, a semi-transmissive electrode, or a reflective electrode.

The second electrode 250 may have a single-layered structure or a multi-layered structure including a plurality of layers.

Color Conversion Layer 300

The color conversion layer 300 may be on the light source 200. The color conversion layer 300 may convert light emitted from the light source 200 into light of a different color or transmit it without color conversion.

The color conversion layer 300 may include quantum dots.

The term "quantum dot" as used herein refers to a crystal of a semiconductor compound, and may include any suitable material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and then growing a quantum dot crystal particle therefrom. When the crystal grows, the organic solvent naturally acts as a dispersant coordinated on the surface of the quantum dot crystal and controls the growth of the crystal so that the growth of quantum dot particles can be easily controlled through a low cost process, compared to vapor deposition methods, such as metal organic chemical vapor deposition (MOCVD) or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include (e.g., may be): a binary compound, such as CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

Examples of the Group III-V semiconductor compound may include (e.g., may be): a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. The Group III-V semiconductor compound may further include a Group II element. Examples of the Group III-V semiconductor compound further including the Group II element may include (e.g., may be) InZnP, InGaZnP, InAlZnP, and/or the like.

Examples of the Group III-VI semiconductor compound may include (e.g., may be): a binary compound, such as GaS, GaSe, $Ga_2Se_3$, GaTe, InS, InSe, $In_2S_3$, $In_2Se_3$, InTe, and/or the like; a ternary compound, such as $InGaS_3$, $InGaSe_3$, and/or the like; or any combination thereof.

Examples of the Group I-III-VI semiconductor compound may include (e.g., may be): a ternary compound, such as AgInS, AgInS$_2$, CuInS, CuInS$_2$, CuGaO$_2$, AgGaO$_2$, AgAlO$_2$, and/or the like; or any combination thereof.

Examples of the Group IV-VI semiconductor compound may include (e.g., may be): a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include: a single element compound, such as Si, Ge, and/or the like; a binary compound, such as SiC, SiGe, and/or the like; or any combination thereof.

Each element included in a multi-element compound, such as the binary compound, the ternary compound, and/or the quaternary compound, may exist in a particle thereof at a uniform concentration or non-uniform concentration.

The quantum dot may have a single structure or a dual core-shell structure. In the case of the quantum dot having a single structure, a concentration of each element included in the corresponding quantum dot may be uniform. In a quantum dot having a core-shell structure, for example, a material included in the core and a material included in the shell may be different from each other.

The shell of the quantum dot may act as a protective layer that reduces or prevents chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Examples of the shell of the quantum dot may include (e.g., may be) an oxide of metal, metalloid, or non-metal, a semiconductor compound, or any combination thereof. Examples of the oxide of metal, metalloid, or non-metal may include (e.g., may be): a binary compound, such as SiO$_2$, Al$_2$O$_3$, TiO$_2$, ZnO, MnO, Mn$_2$O$_3$, Mn$_3$O$_4$, CuO, FeO, Fe$_2$O$_3$, Fe$_3$O$_4$, CoO, Co$_3$O$_4$, NiO, and/or the like; a ternary compound, such as MgAl$_2$O$_4$, CoFe$_2$O$_4$, NiFe$_2$O$_4$, CoMn$_2$O$_4$, and/or the like; or any combination thereof. Examples of the semiconductor compound may include (e.g., may be): as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. Examples of the semiconductor compound may include (e.g., may be) CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dots may be equal to or less than about 45 nm, for example, equal to or less than about 40 nm, and for example, equal to or less than about 30 nm, and within these ranges, color purity or color reproducibility may be improved. In addition, because the light emitted through the quantum dots is emitted in all directions, the wide viewing angle may be improved.

In addition, the quantum dot may be specifically, spherical, pyramidal, multi-arm, or cubic nanoparticles, nanotubes, nanowires, nanofibers, or nanoplate particles.

Because the energy band gap may be adjusted by controlling the size of the quantum dots, light having various suitable wavelength bands may be obtained from the emission layer including the quantum dots. Accordingly, by utilizing the quantum dots of different sizes, a light-emitting device that emits light of various suitable wavelengths may be implemented. For example, the size of the quantum dots may be selected to emit red light, green light, and/or blue light. In addition, the size of the quantum dots may be selected to emit white light by combination of light of various colors.

The color conversion layer 300 may include a plurality of color conversion regions. In an embodiment, the color conversion layer 300 may include: a first region emitting a first-color light; a second region emitting a second-color light; and a third region emitting a third-color light, wherein the first-color light, the second-color light, and/or the third-color light may have different maximum emission wavelengths from each other.

In an embodiment, the first color light may be red light, the second color light may be green light, and the third color light may be blue light.

The plurality of the color conversion regions may include the quantum dots. In an embodiment, the first region may include red quantum dots, the second region may include green quantum dots, and the third region may not include quantum dots. Details on the quantum dots may be the same as described herein. Each of the first region, the second region, and/or the third region may further include a scatter (e.g., light scattering particles).

UV-Absorbing Layer 400

The UV-absorbing layer 400 may be on the color conversion layer 300.

The UV-absorbing layer 400 may selectively absorb a part (e.g., a portion) of light emitted from the light source 200 and the color conversion layer 300. For example, the UV-absorbing layer 400 may selectively absorb light having a wavelength of equal to or less than about 380 nm.

In an embodiment, a thickness of the UV-absorbing layer 400 may be in a range of about 1 μm to about 3 μm.

In an embodiment, the UV-absorbing layer 400 may include a UV-absorbing compound, and examples of the UV-absorbing compound may include (e.g., may be): a benzophenone-containing compound, a benzoquinone-containing compound, a benzoanthraquinone-containing compound, a xanthone-containing compound, a benzotriazine-containing compound, a benzotriazinone-containing compound, a benzotriazole-containing compound, a benzoate-containing compound, a cyanoacrylate-containing compound, a triazine-containing compound, an oxanilide-containing compound, a salicylate-containing compound, a pyrene-containing compound, a naphthalene-containing compound, or an anthracene-containing compound, each substituted with a hydroxyl group; a catechol-containing compound; or a piperidine-containing compound.

In an embodiment, the UV-absorbing compound may include one of the groups represented by Formulae 1-1 to 1-5:

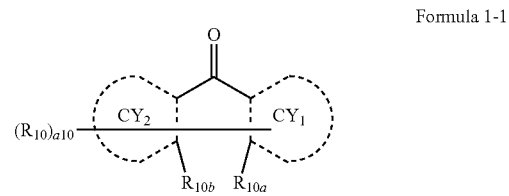

Formula 1-1

-continued

Formula 1-2

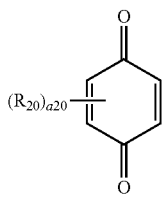

Formula 1-3

Formula 1-4

Formula 1-5

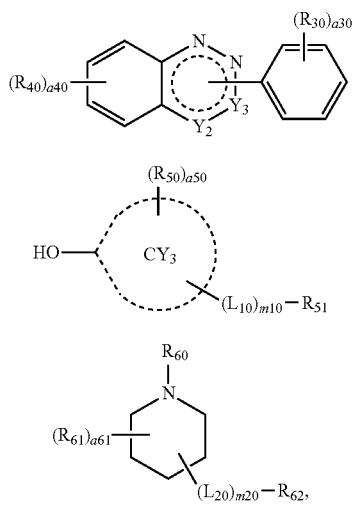

wherein, in Formulae 1-1 to 1-5, $CY_1$ to $CY_3$ may each independently be selected from a benzene group, a naphthalene group, an anthracene group, a pyrene group, and a phenanthrene group, $L_{10}$ and $L_{20}$ may each independently be a single bond, —O—, —S—, —S(=O)$_2$—, —C(=O)—, —C(=O)O—, —C(=O)NH—, a $C_1$-$C_{30}$ hydrocarbon group, a $C_5$-$C_{60}$ carbocyclic group, or a $C_2$-$C_{30}$ heterocyclic group, m10 and m20 may each independently be an integer from 0 to 20, when m10 is 0, $L_{10}$ may be a single bond, and when m20 is 0, $L_{20}$ may be a single bond.

$R_{10a}$ and $R_{10b}$ may each independently be selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), and —P(=O)(Q$_1$)(Q$_2$), $R_{10a}$ and $R_{10b}$ may optionally be linked to each other to form a —(Y$_1$)$_{k1}$— linking group, $Y_1$ may be —O—, —S—, or —C(=O)—, k1 may be an integer from 1 to 3, one of $Y_2$ and $Y_3$ may be N, and the other may be a single bond, a double bond, or —C(=O)—, $R_{10}$, $R_{20}$, $R_{30}$, $R_{40}$, $R_{50}$, $R_{51}$, $R_{60}$, $R_{61}$, and $R_{62}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), and —P(=O)(Q$_1$)(Q$_2$), a10 may be an integer from 1 to 8, a20 may be an integer of 1 to 4, a30 and a40 may each independently be an integer from 1 to 4, a50 may be an integer from 1 to 9, a61 may be an integer from 1 to 5, at least one of $R_{10}$(s) in the number of a10 may be a hydroxyl group, at least one of $R_{20}$(s) in the number of a20 may be a hydroxyl group, and at least one of $R_{30}$(s) in the number of a30 may be a hydroxyl group.

In one or more embodiments, the UV-absorbing compound may include one of groups represented by Formulae 2-1 to 2-12:

2-1

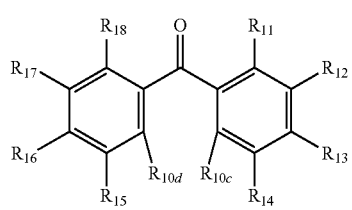

2-2

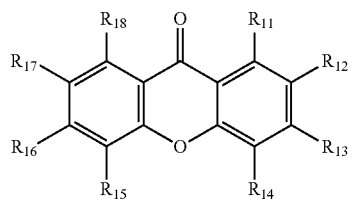

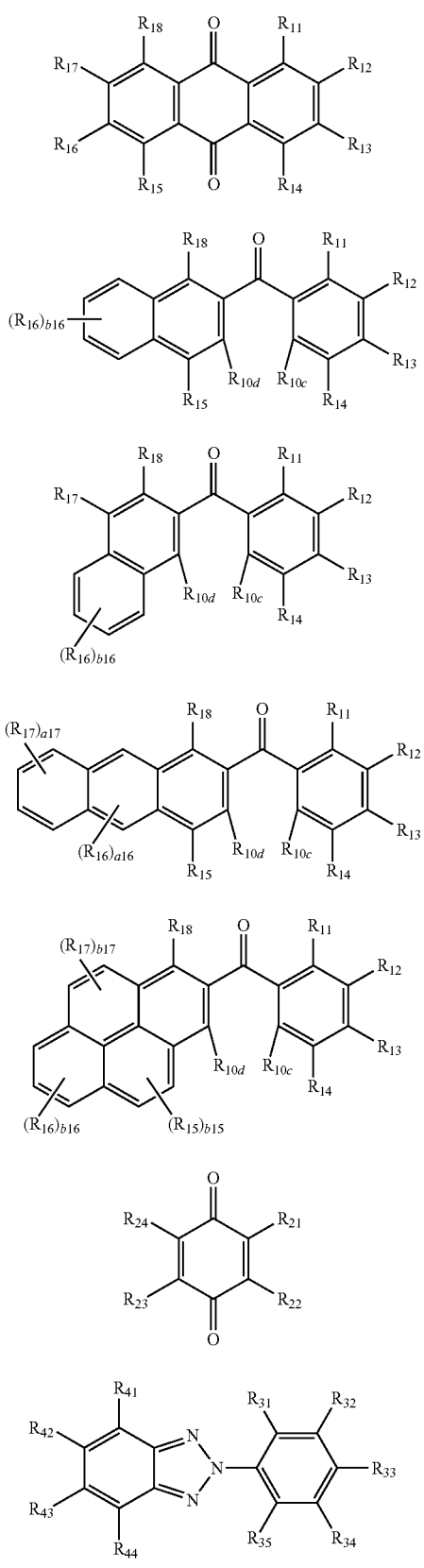

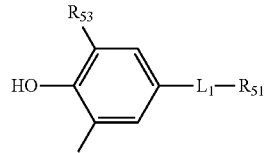

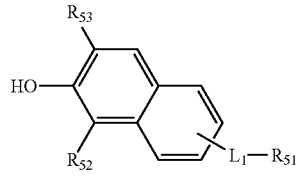

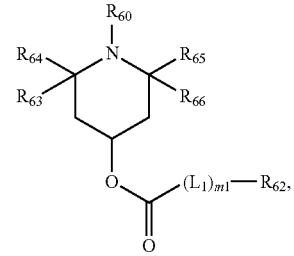

wherein, in Formulae 2-1 to 2-12,

L$_1$ may be the same as described in connection with L$_{10}$, m1 may be an integer from 0 to 6, R$_{10c}$, R$_{10d}$, and R$_{11}$ to R$_{18}$ may each independently be the same as described in connection with R$_{10}$, a16 may be 1 or 2, a17 may be an integer from 1 to 4, b15 may be 1 or 2, b16 may be an integer from 1 to 4, b17 may be 1 or 2, R$_{21}$ to R$_{24}$ may each independently be the same as described in connection with R$_{20}$, R$_{31}$ to R$_{35}$ may each independently be the same as described in connection with R$_{30}$, R$_{41}$ to R$_{44}$ may each independently be the same as described in connection with R$_{40}$, R$_{60}$ and R$_{62}$ may each independently be the same as described herein, R$_{63}$ to R$_{66}$ may each independently be the same as described in connection with R$_{61}$, and at least one of R$_{11}$ to R$_{18}$, at least one of R$_{21}$ to R$_{23}$, and at least one R$_{31}$ to R$_{35}$ may each independently be a hydroxyl group.

In one or more embodiments, the UV-absorbing compound may include one of groups represented by Formulae 3-1 to 3-10:

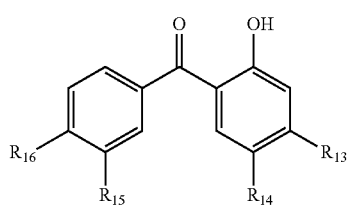

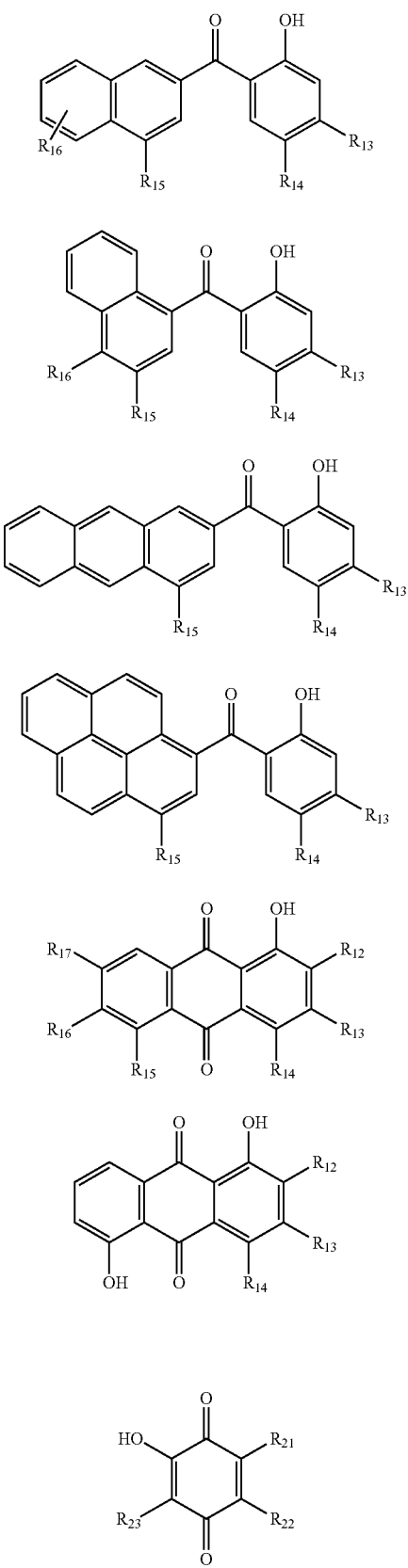

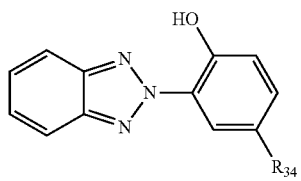

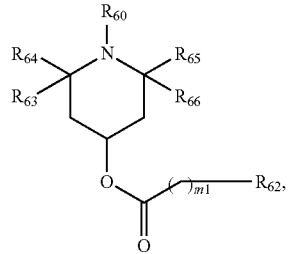

wherein, in Formulae 3-1 to 3-10, $R_{13}$ to $R_{17}$ may each independently be the same as described in connection with $R_{10}$, $R_{21}$ to $R_{23}$ may each independently be the same as described in connection with $R_{20}$, $R_{34}$ may be the same as described in connection with $R_{30}$, $R_{60}$ and $R_{62}$ may each independently be the same as described herein, $R_{63}$ to $R_{66}$ may each independently be the same as described in connection with $R_{61}$, and m1 may be 8.

For example, the UV-absorbing compound may include 6-(2-benzotriazolyl)-4-t-octyl-6'-t-butyl-4'-methyl-2.2'-methylenebisphenol, Tinuvin 292, and/or the like.

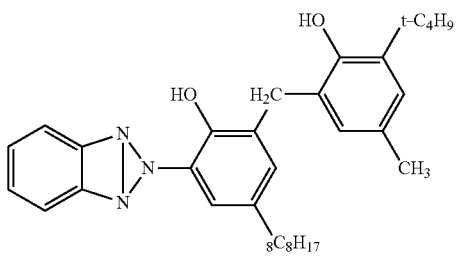

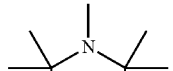

6-(2-Benzotriazoly)-4-t-octyl-6'-t-butyl-4'-methyl-2.2'-methylenebisphenol

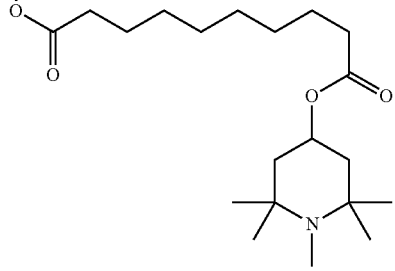

Tinuvin 292

In an embodiment, an amount of the UV-absorbing compound may be in a range of about 1 parts by weight to about 5 parts by weight based on 100 parts by weight of the UV-absorbing layer 400.

Color Filter 500

The color filter 500 may be on the UV-absorbing layer 400. The color filter 500 may transmit light emitted from the color conversion layer 300.

The color filter 500 may include a plurality of color filter regions. For example, the color filter 500 may include: a first-first region emitting a first first-color light; a second-first region emitting a second first-color light; and a third-first region emitting a third first-color light. The first-first region to the third-first region may selectively transmit light of different colors from each other.

In an embodiment, the first-first region may include a first-color pigment and/or dye, and may selectively transmit a first-color light. The first-color light may be, for example, red light having (e.g., belonging to) a wavelength band in a range of about 580 nm to about 780 nm. In an embodiment, the second-first region may include a second-color pigment and/or dye, and may selectively transmit a second-color light.

The second-color light may be, for example, green light having (e.g., belonging to) a wavelength band in a range of about 495 nm to about 580 nm. In an embodiment, the third-first region may include a third-color pigment and/or dye, and may selectively transmit a third-color light. The third-color light may be, for example, blue light having (e.g., belonging to) a wavelength band in a range of about 400 nm to about 495 nm.

In an embodiment, the first region of the color conversion layer 300 may be between the light source 200 and the first-first region of the color filter 500, the second region of the color conversion layer 300 may be between the light source 200 and the second-first region of the color filter 500, and the third region of the color conversion layer 300 may be between the light source 200 and the third-first region of the color filter 500.

The color filter 500 including the plurality of the color filter areas may further include light-shielding patterns interposed between the color filter areas, and the color conversion layer 300 including the plurality of the color conversion areas may further include light-shielding patterns interposed between the color conversion areas.

In the electronic apparatus 1 according to an embodiment, the UV-absorbing layer 400 may include a UV-absorbing compound, and at the same time, may serve to provide a flat upper surface for the color filter 500.

In some embodiments, the electronic apparatus 1 according to an embodiment may include a second planarization layer between the color conversion layer 300 and the UV-absorbing layer 400 to provide a flat upper surface for the color filter 500.

The electronic apparatus 1 according to an embodiment may include the UV-absorbing layer 400 between the color conversion layer 300 the color filter 500. The UV-absorbing layer 400 may absorb UV light emitted from the light source 200 and the color conversion layer 300 so that damage of the color filter caused by UV light may be prevented or substantially prevented.

The region emitting blue light among the plurality of the color conversion regions of the color conversion layer 300 may transmit blue light emitted from the light source 200 to emit blue light without additional conversion. Here, UV light emitted from the light source 200 may be also transmitted together so that a portion of the color filter 500 may be damaged by UV light. By including the UV-absorbing layer 400 between the color conversion layer 300 and the color filter 500, the electronic apparatus 1 may be able to prevent or substantially prevent such damage and provide high quality.

In one or more embodiments, the electronic apparatus 1 may include:
- a first planarization layer between the light source 200 and the color conversion layer 300;
- a first capping layer between the first planarization layer and the color conversion layer 300;
- a second capping layer between the color conversion layer 300 and the UV-absorbing layer 400; and/or
- a second planarization layer between the second capping layer and the UV-absorbing layer 400.

Each of the first capping layer and the second capping layer may include a material having a refractive index of equal to or greater than 1.6 (at 589 nm).

The first capping layer and the second capping layer may each independently be an organic capping layer including an organic material, an inorganic capping layer including an inorganic material, or an organic-inorganic composite capping layer including an organic material and an inorganic material.

In an embodiment, at least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may each optionally be substituted with a substituent including O, N, S, Se, Si, F, CI, Br, I, or any combination thereof. In one or more embodiments, at least one of the first capping layer and the second capping layer may each independently include an amine group-containing compound.

Figure 3:
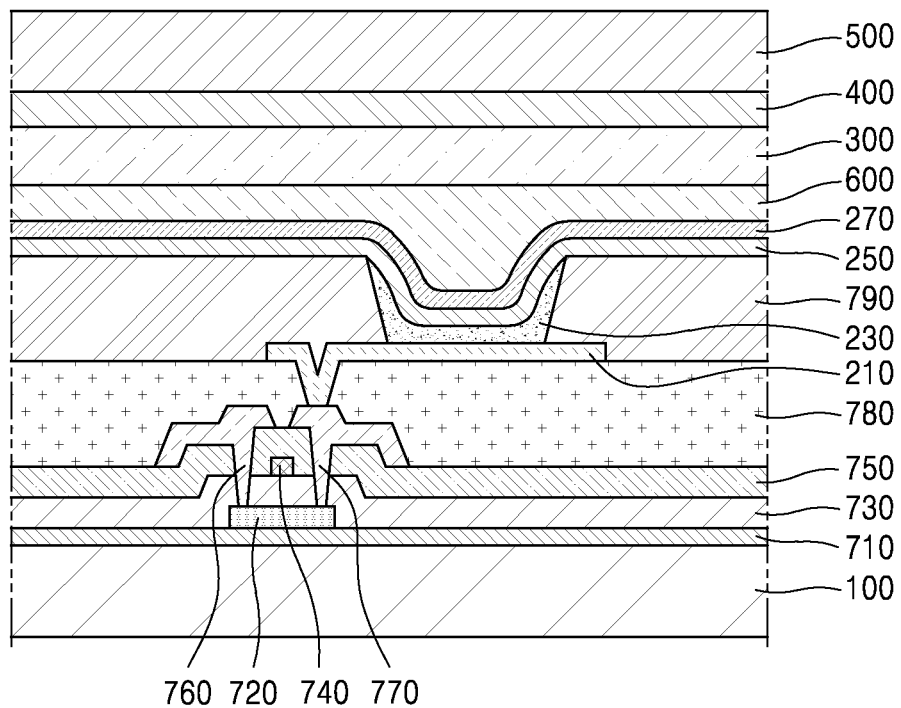
FIG. 3 is a schematic cross-sectional view of an electronic apparatus according to an embodiment.

Description of FIG. 3

FIG. 3 is a cross-sectional view of an electronic apparatus according to an embodiment of the present disclosure.

The electronic apparatus of FIG. 3 may include the substrate 100, a thin-film transistor (TFT), and a light-emitting device.

The substrate 100 may be a flexible substrate, a glass substrate, or a metal substrate. A buffer layer 710 may be on the substrate 100. The buffer layer 710 may prevent or reduce penetration of impurities through the substrate 100, and may provide a flat surface on the substrate 100.

The TFT may be on the buffer layer 710. The TFT may include an activation layer 720, a gate electrode 740, a source electrode 760, and a drain electrode 770.

The activation layer 720 may include an inorganic semiconductor such as silicon and/or polysilicon, an organic semiconductor, and/or an oxide semiconductor, and may also include a source region, a drain region, and a channel region.

A gate insulating film 730 for insulating the activation layer 720 and the gate electrode 740 may be on the activation layer 720, and the gate electrode 740 may be on the gate insulating film 730.

An interlayer insulating film 750 may be on the gate electrode 740. The interlayer insulating film 750 may be between the gate electrode 740 and the source electrode 760 and between the gate electrode 740 and the drain electrode 770, to insulate the source electrode 760 and the drain electrode 770 from the gate electrode 740.

The source electrode 760 and the drain electrode 770 may be on the interlayer insulating film 750. The interlayer insulating film 750 and the gate insulating film 730 may be formed to expose the source region and the drain region of the activation layer 720, and the source electrode 760 and the drain electrode 770 may be in contact with the exposed portions of the source region and the drain region of the activation layer 720.

As such, the TFT may be electrically connected to a light-emitting device for operation, and may be covered and protected by a passivation layer 780. The passivation layer 780 may include an inorganic insulating film, an organic insulating film, or any combination thereof. The light-emitting device may be then provided on the passivation layer 780. The light-emitting device may include a first electrode 210, an interlayer 230, and a second electrode 250.

The first electrode 210 may be on the passivation layer 780. The passivation layer 280 may be arranged to expose a portion of the drain electrode 770 without fully covering the drain electrode 770, and the first electrode 210 may be arranged to be connected to the exposed portion of the drain electrode 770.

A pixel-defining layer 790 including an insulating material may be on the first electrode 210. The pixel-defining layer 790 may expose a portion of the first electrode 210, and the interlayer 230 may be formed in the exposed portion of the first electrode 210. The pixel-defining layer 790 may be a polyimide organic film or a polyacrylic organic film. In some embodiments, at least some layers of the interlayer 230 may extend beyond the upper portion of the pixel-defining layer 790 and may thus be arranged in the form of a common layer.

The second electrode 250 may be on the interlayer 230, and a first capping layer 270 may be additionally formed on the second electrode 250. The first capping layer 270 may be formed to cover the second electrode 250.

A first planarization layer 600 may be on the first capping layer 270, and a color conversion layer 300 may be on the first planarization layer 600. In some embodiments, the color conversion layer 300 may include a plurality of color conversion regions, such as a first region to emit red light, a second region to emit green light, and a blue light emitting region (e.g., a third region to emit or transmit blue light). Details on the color conversion layer 300 may be the same as described herein.

In some embodiments, a black matrix (BM) may exist between the plurality of the color conversion regions, to separate each color conversion region and prevent or reduce color mixing of each region. For example, the BM may be positioned between the first region and the second region and between the second region and the third region.

The UV-absorbing layer 400 may be on the color conversion layer 300. The UV-absorbing layer 400 may absorb a portion of light emitted from the light source 200 and the color conversion layer 300. Details for the UV-absorbing layer 400 may be the same as described herein.

In some embodiments, the first capping layer 270 may be formed between the first planarization layer 600 and the color conversion layer 300, and a second capping layer may be formed between the color conversion layer 300 and the UV-absorbing layer 400.

The color filter 500 may be on the UV-absorbing layer 400. The color filter 500 may include a plurality of color filter regions. For example, the color filter 500 may include a first-first region to emit red light, a second-first region to emit green light, and a third-first region to emit blue light. Details on the color filter 500 may be the same as described herein. In some embodiments, an overcoat layer may be additionally formed on the color filter 500.

The electronic apparatus may be applied to various suitable displays, light sources, lighting (e.g., lighting apparatus), personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Manufacturing Method

Another aspect of the present disclosure provides a method of manufacturing the electronic apparatus, the method including:
  preparing a light source on a substrate;
  preparing a color conversion layer on the light source;
  preparing a UV-absorbing layer on the color conversion layer; and
  preparing a color filter on the UV-absorbing layer.
  Here, the light source may be a light-emitting device.
  The color conversion layer may include quantum dots.
  The UV-absorbing layer may absorb light having a wavelength of equal to or less than 380 nm.
  Each of the layers constituting the electronic apparatus may be formed in a certain region by utilizing one or more suitable methods selected from vacuum deposition, spin coating, casting, Langmuir-Blodgett (LB) deposition, ink-jet printing, laser-printing, and laser-induced thermal imaging.

Definition of Terms

The term "$C_3$-$C_{60}$ carbocyclic group" as used herein refers to a cyclic group consisting of only carbon atoms as ring-forming atoms and having three to sixty carbon atoms, and the term "$C_1$-$C_{60}$ heterocyclic group" as used herein refers to a cyclic group that has, in addition to one to sixty carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and further includes *—N=*' as a ring-forming moiety.

For example,
  the $C_3$-$C_{60}$ carbocyclic group may be i) a T1 group or ii) a condensed cyclic group in which at two or more T1 groups are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which two or more T2 groups are condensed with each other, or iii) a condensed cyclic group in which at least one T2 group and at least one T1 group are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) a T1 group, ii) a condensed cyclic group in which two or more T1 groups are condensed with each other, iii) a T3 group, iv) a condensed cyclic group in which two or more T3 groups are condensed with each other, or v) a condensed cyclic group in which at least one T3 group and at least one T1 group are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like), the π electron-deficient nitrogen-containing $C_1$-$C_{60}$ cyclic group may be i) a T4 group, ii) a condensed cyclic group in which two or more T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, the 17 electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein each refer to a group connected (e.g., condensed) to a cyclic group, a monovalent group, or a polyvalent group (for example, a divalent group, a trivalent group, a tetravalent group, and/or the like) according to the structure of a formula for which the corresponding term is used. For example, the "benzene group" may be a benzo group, a phenyl group, a phenylene group, and/or the like, which may be easily understood by one of ordinary skill in the art according to the structure of a formula including the "benzene group".

Examples of the monovalent $C_3$-$C_{60}$ carbocyclic group and the monovalent $C_1$-$C_{60}$ heterocyclic group may include (e.g., may be) a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include (e.g., may be) a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include (e.g., may be) a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, a tert-decyl group, and/or the like. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond at a main chain (e.g., in the middle) or at a terminal end (e.g., the terminus) of the $C_2$-$C_{60}$ alkyl group, and examples thereof may include (e.g., may be) an ethenyl group, a propenyl group, a butenyl group, and/or the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond at a main chain (e.g., in the middle) or at a terminal end (e.g., the terminus) of the $C_2$-$C_{60}$ alkyl group, and examples thereof may include (e.g., may be) an ethynyl group, a propynyl group, and/or the like. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein Ani is the $C_1$-$C_{60}$ alkyl group), and examples thereof may include (e.g., may be) a methoxy group, an ethoxy group, an isopropyloxy group, and/or the like.

The term "$C_3$-$C_{10}$ cycloalkyl group" as used herein refers to a monovalent saturated hydrocarbon cyclic group having three to ten carbon atoms, and examples thereof may include (e.g., may be) a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and/or the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to 1 to 10 carbon atoms, at least one heteroatom as a ring-forming atom, and examples thereof may include (e.g., may be) a 1,2,3,4-oxatriazolidinyl group, a tetrahydrofuranyl group, a tetrahydrothiophenyl group, and/or the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms, at least one carbon-carbon double bond in the ring thereof, and no aromaticity, and examples thereof may include (e.g., may be) a cyclopentenyl group, a cyclohexenyl group, a cycloheptenyl group, and/or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to 1 to 10 carbon atoms, at least one heteroatom as a ring-forming atom, and at least one carbon-carbon double bond in the cyclic structure thereof. Examples of the $C_1$-$C_{10}$ heterocycloalkenyl group may include (e.g., may be) a 4,5-dihydro-1,2,3,4-oxatriazolylgroup, a 2,3-dihydrofuranyl group, a 2,3-dihydrothiophenyl group, and/or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group may include (e.g., may be) a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and/or the like. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system that has, in addition to 1 to 60 carbon atoms, at least one heteroatom as a ring-forming atom. The term "$C_1$-$C_{60}$ heteroarylene group" as used herein refers to a divalent group having a heterocyclic aromatic system that has, in addition to 1 to 60 carbon atoms, at least one heteroatom as a ring-forming atom. Examples of the $C_1$-$C_{60}$ heteroaryl group may include (e.g., may be) a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, a carbazolyl group, a dibenzofuranyl group, a dibenzothiofuranyl group, and/or the like. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its entire molecular structure (e.g., the entire molecular structure is not aromatic). Examples of the monovalent non-aromatic condensed polycyclic group may include (e.g., may be) an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group having two or more rings condensed with each other, at least one heteroatom other than carbon atoms (for example, having 1 to 60 carbon atoms), as a ring-forming atom, and no aromaticity in its entire molecular structure (e.g., the entire molecular structure is not aromatic). Examples of the monovalent non-aromatic condensed heteropolycyclic group may include (e.g., may be) a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, an azaadamantyl group, and/or the like. The term "divalent non-aromatic condensed heteropolycyclic group" as used herein refers to a divalent group having the same structure as the monovalent non-aromatic condensed heteropolycyclic group described above.

The term "$C_6$-$C_{60}$ aryloxy group" as used herein refers to a monovalent group represented by —$OA_{102}$ (wherein $A102$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_{60}$ arylalkyl group" as used herein refers to a monovalent group represented by -$A_{104}A_{105}$ (wherein $A_{104}$ is a $C_1$-$C_{54}$ alkylene group and $A_{105}$ is a $C_6$-$C_{59}$ aryl group), and the term "$C_2$-$C_{60}$ heteroarylalkyl group" as used herein refers to a monovalent group represented by -$A_{106}A_{107}$ (wherein $A_{106}$ is a $C_1$-$C_{59}$ alkylene group and $A_{107}$ is a $C_1$-$C_{59}$ heteroaryl group).

The term "$R_{10a}$" as used herein refers to:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof,
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the present specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a alkoxy group, a phenyl group, a biphenyl group, or any combination thereof.

The term "heteroatom" as used herein refers to any atom other than a carbon atom. Examples of the heteroatom may include (e.g., may be) O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the term "ter-Bu," "tBu," or "But" as used herein refers to a tert-butyl group, and the term "OMe" as used herein refers to a methoxy group.

The term "biphenyl group" as used herein refers to "a phenyl group substituted with a phenyl group". In other words, the "biphenyl group" belongs to "a substituted phenyl group having a $C_6$-$C_{60}$ aryl group as a substituent".

The term "terphenyl group" as used herein refers to "a phenyl group substituted with a biphenyl group". In other words, the "terphenyl group" belongs to "a substituted phenyl group having, as a substituent, a $C_6$-$C_{60}$ aryl group substituted with a $C_6$-$C_{60}$ aryl group".

Hereinafter, compounds according to embodiments and light-emitting devices according to embodiments will be described in more detail with reference to the following synthesis examples and examples. The wording "B was utilized instead of A" used in describing Synthesis Examples refers to that an identical molar equivalent of B was utilized in place of A.

EXAMPLES

Example 1

A color conversion layer including quantum dots was formed on an OLED emitting blue light, and an overcoat layer was formed on the color conversion layer. A UV-absorbing layer including Tinuvin 292 was formed on the overcoat layer, and a color filter (CF) layer was formed on the UV-absorbing layer, thereby manufacturing a panel.

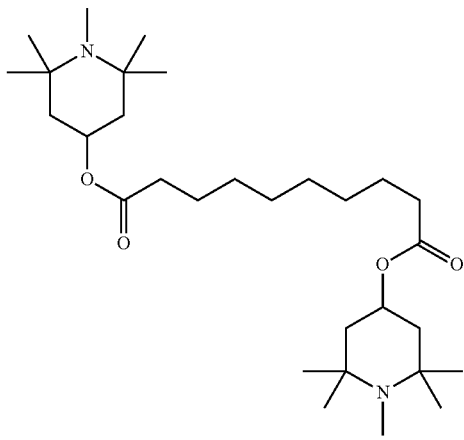

Tinubin 292

Example 2

A color conversion layer including quantum dots was formed on an OLED emitting blue light, an overcoat layer including Tinuvin 292 was formed on the color conversion layer, and a CF layer was formed on the UV-absorbing layer, thereby manufacturing a panel. Here, an amount of Tinuvin 292 in the overcoat layer was about 3 parts by weight based on 100 parts by weight of the overcoat layer.

Comparative Example 1

A color conversion layer including quantum dots was formed on an OLED emitting blue light, an overcoat layer was formed on the color conversion layer, and a CF layer was formed on the overcoat layer, thereby manufacturing a panel.

Evaluation Example

First, the max transmittance ($T_1$) of each of the color filters utilized in the panels according to Examples 1 and 2 and Comparative Example 1 was measured by a UV-Vis spectrometer. Next, the OLED emitting blue light of each panel was left at room temperature for 500 hours while it was turned on, and the maximum transmittance ($T_2$) of each of the color filters utilized in the panels was measured again with a UV-Vis spectrometer.

For each of Examples 1 and 2 and Comparative Example 1, four panels were prepared in the same manner, and the transmittance thereof was measured by the above method. The results are shown in Table 1.

TABLE 1

|  | $T_1$ (%) | $T_2$ (%) |
| --- | --- | --- |
| Example 1 | 66.4 | 66.3 |
|  | 65.9 | 66.3 |
|  | 65.8 | 65.8 |
|  | 64.3 | 64.7 |
| Example 2 | 63.5 | 62.4 |
|  | 63.9 | 62.7 |
|  | 63.8 | 62.7 |
|  | 63.1 | 62.3 |
| Comparative Example 1 | 64.3 | 60.7 |
|  | 64.4 | 60.5 |
|  | 64.4 | 60.5 |
|  | 64.3 | 60.6 |

Referring to Table 1, it was confirmed that the panels according to Examples 1 and 2 had less change in the transmittance variations before and after exposure to blue light of the OLED, as compared to the panel according to Comparative Example 1.

According to one or more embodiments, damage to a color filter may be prevented or reduced when a UV-absorbing layer is utilized to absorb UV light emitted from a light source and a color conversion layer, thereby realizing an electronic apparatus with improved quality.

The use of "may" when describing embodiments of the inventive concept refers to "one or more embodiments of the inventive concept."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An electronic apparatus comprising:
a substrate;
a light source on the substrate;
a color conversion layer on the light source;
a UV-absorbing layer on the color conversion layer; and
a color filter on the UV-absorbing layer,
wherein the UV-absorbing layer is to absorb a portion of light emitted from the light source and the color conversion layer.

2. The electronic apparatus of claim 1, wherein the light source is to emit blue light.

3. The electronic apparatus of claim 1, wherein the light source comprises a light-emitting device, and the light-emitting device comprises:
a first electrode;
a second electrode facing the first electrode; and
an interlayer between the first electrode and the second electrode and comprising an emission layer.

4. The electronic apparatus of claim 1, wherein the color conversion layer comprises quantum dots.

5. The electronic apparatus of claim 1, wherein the color conversion layer comprises:
a first region to emit a first-color light;
a second region to emit a second-color light; and
a third region to emit a third-color light.

6. The electronic apparatus of claim 5, wherein the first-color light is red light,
the second-color light is green light, and
the third-color light is blue light.

7. The electronic apparatus of claim 5, wherein the first region comprises red quantum dots, and
the second region comprises green quantum dots.

8. The electronic apparatus of claim 1, wherein the UV-absorbing layer is to absorb light having a wavelength of equal to or less than 380 nm.

9. The electronic apparatus of claim 1, wherein a thickness of the UV-absorbing layer is in a range of about 1 μm to about 3 μm.

10. The electronic apparatus of claim 1, wherein the UV-absorbing layer comprises a UV-absorbing compound, and
the UV-absorbing compound comprises:
a benzophenone-containing compound, a benzoquinone-containing compound, a benzoanthraquinone-containing compound, a xanthone-containing compound, a benzotriazine-containing compound, a benzotriazinone-containing compound, a benzotriazole-containing compound, a benzoate-containing compound, a cyanoacrylate-containing compound, a triazine-containing compound, an oxanilide-containing compound, a salicylate-containing compound, a pyrene-containing compound, a naphthalene-containing compound, and/or an anthracene-containing compound, each substituted with a hydroxyl group;
a catechol-containing compound; and/or
a piperidine-containing compound.

11. The electronic apparatus of claim 10, wherein the UV-absorbing compound comprises one of groups represented by Formulae 1-1 to 1-5:

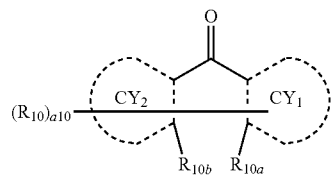

Formula 1-1

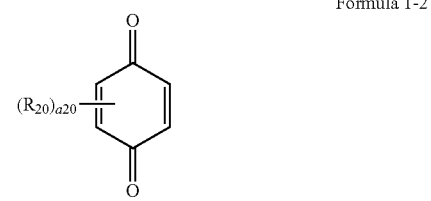

Formula 1-2

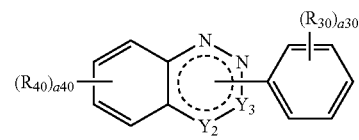

Formula 1-3

Formula 1-4

HO—CY₃—(R₅₀)ₐ₅₀
(L₁₀)ₘ₁₀—R₅₁

Formula 1-5

R₆₀—N
(R₆₁)ₐ₆₁
(L₂₀)ₘ₂₀—R₆₂, and wherein, in Formulae 1-1 to 1-5, $CY_1$ to $CY_3$ are each independently selected from a benzene group, a naphthalene group, an anthracene group, a pyrene group, and a phenanthrene group, $L_{10}$ and $L_{20}$ are each independently —O—, —S—, —S(=O)₂—, —C(=O)—, —C(=O)O—, —C(=O)NH—, a $C_1$-$C_{30}$ hydrocarbon group, a $C_5$-$C_{60}$ carbocyclic group, or a $C_2$-$C_{30}$ heterocyclic group, m10 and m20 are each independently an integer from 0 to 20, $L_{10}$ is a single bond when m10 is 0, and $L_{20}$ is a single bond when m20 is 0, $R_{10a}$ and $R_{10b}$ are each independently selected from hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q₁)(Q₂)(Q₃), —N(Q₁)(Q₂), —B(Q₁)(Q₂), —C(=O)(Q₁), —S(=O)₂(Q₁), and —P(=O)(Q₁)(Q₂), $R_{10a}$ and $R_{10b}$ are optionally linked to each other to form a —(Y₁)ₖ₁-linking group, $Y_1$ is —O—, —S—, or —C(=O)—, k1 is an integer from 1 to 3, one of $Y_2$ and $Y_3$ is N, and an other one of $Y_2$ and $Y_3$ is a single bond, a double bond, or —C(=O)—, $R_{10}$, $R_{20}$, $R_{30}$, $R_{40}$, $R_{50}$, $R_{51}$, $R_{60}$, $R_{61}$, and $R_{62}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q₁)(Q₂)(Q₃), —N(Q₁)(Q₂), —B(Q₁)(Q₂), —C(=O)(Q₁), —S(=O)₂(Q₁), and —P(=O)(Q₁)(Q₂), a10 is an integer from 1 to 8, a20 is an integer of 1 to 4, a30 and a40 are each independently an integer from 1 to 4, a50 and a61 are each independently an integer from 1 to 9, at least one of $R_{10}$(s) in a number of a10 is a hydroxyl group, at least one of $R_{20}$(s) in a number of a20 is a hydroxyl group, at least one of $R_{30}$(s) in a number of a30 is a hydroxyl group.

12. The electronic apparatus of claim 11, wherein the UV-absorbing compound comprises one of groups represented by Formulae 2-1 to 2-12:

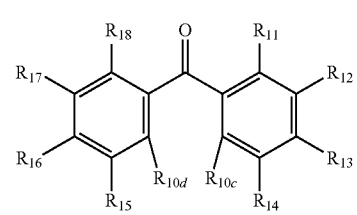

2-1

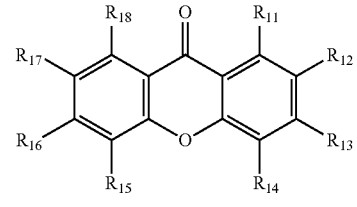

2-2

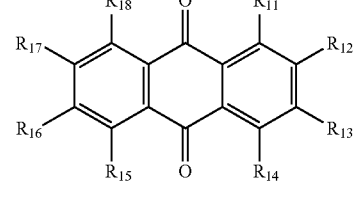

2-3

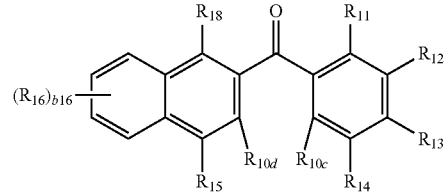

2-4

-continued 2-5
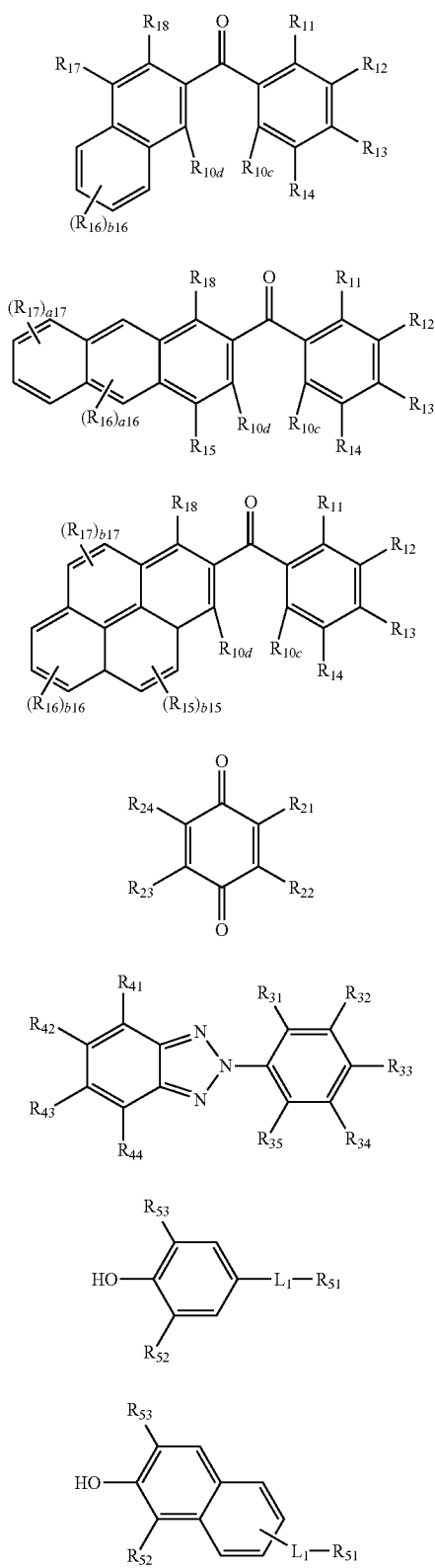

2-6

2-7

2-8

2-9

2-10

2-11

-continued 2-12
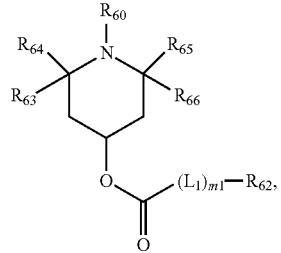

and
wherein, in Formulae 2-1 to 2-12,
$L_1$ is the same as described in connection with $L_{10}$ of Formulae 1-1 to 1-5,
m1 is an integer from 0 to 6,
$R_{10c}$, $R_{10d}$, and $R_{11}$ to $R_{18}$ are each independently the same as described in connection with $R_{10}$ of Formulae 1-1 to 1-5,
a16 is 1 or 2,
a17 is an integer from 1 to 4,
b15 is 1 or 2,
b16 is an integer from 1 to 4,
b17 is 1 or 2,
$R_{21}$ to $R_{23}$ are each independently the same as described in connection with $R_{20}$ of Formulae 1-1 to 1-5,
$R_{31}$ to $R_{35}$ are each independently the same as described in connection with $R_{30}$ of Formulae 1-1 to 1-5,
$R_{41}$ to $R_{44}$ are each independently the same as described in connection with $R_{40}$ of Formulae 1-1 to 1-5,
$R_{60}$ and $R_{62}$ are respectively the same as described in connection with Formulae 1-1 to 1-5,
$R_{63}$ to $R_{66}$ are each as described in connection with $R_{61}$ of Formulae 1-1 to 1-5, and
at least one of $R_{11}$ to $R_{18}$, at least one of $R_{21}$ to $R_{23}$, and at least one $R_{31}$ to $R_{35}$ are each a hydroxyl group.

13. The electronic apparatus of claim 10, wherein
an amount of the UV-absorbing compound is in a range of about 1 part by weight to about 5 parts by weight based on 100 parts by weight of the UV-absorbing layer.

14. The electronic apparatus of claim 1, wherein
the color filter comprises:
a first-first region to emit a first first-color light;
a second-first region to emit a second first-color light; and
a third-first region to emit a third first-color light.

15. The electronic apparatus of claim 1, further comprising
a second planarization layer between the color conversion layer and the UV-absorbing layer.

16. The electronic apparatus of claim 1, further comprising
a second capping layer between the color conversion layer and the UV-absorbing layer.

17. A method of manufacturing an electronic apparatus, the method comprising:
preparing a light source on a substrate;
preparing a color conversion layer on the light source;
preparing a UV-absorbing layer on the color conversion layer; and
preparing a color filter on the UV-absorbing layer.

18. The method of claim 17, wherein
the light source is a light-emitting device.

19. The method of claim 17, wherein
the color conversion layer comprises quantum dots.

20. The method of claim 19, wherein
the UV-absorbing layer is to absorb light having a wavelength of equal to or less than 380 nm.

* * * * *